United States Patent
Wu et al.

(10) Patent No.: US 7,629,265 B2
(45) Date of Patent: Dec. 8, 2009

(54) CLEANING METHOD FOR USE IN SEMICONDUCTOR DEVICE FABRICATION

(75) Inventors: Chia-Wei Wu, Taichung (TW); Tuung Luoh, Hsinchu (TW); Ling-Wuu Yang, Hsinchu (TW); Kuang-Chao Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 375 days.

(21) Appl. No.: 11/352,547

(22) Filed: Feb. 13, 2006

(65) Prior Publication Data

US 2007/0190797 A1    Aug. 16, 2007

(51) Int. Cl.
*H01L 21/301* (2006.01)
*H01L 21/461* (2006.01)

(52) U.S. Cl. .......... 438/745; 438/692; 438/751; 438/754; 134/3; 134/6; 134/26; 134/29

(58) Field of Classification Search .......... 438/750, 438/745, 692, 751, 754, 689; 134/3, 6, 26, 134/28, 29
See application file for complete search history.

(56) References Cited

U.S. PATENT DOCUMENTS

| 2004/0150054 A1* | 8/2004 | Hirano ............. 257/371 |
| 2005/0130414 A1* | 6/2005 | Choi et al. ......... 438/672 |
| 2005/0250316 A1* | 11/2005 | Choi et al. ......... 438/637 |
| 2006/0054595 A1* | 3/2006 | Starzynski .......... 216/57 |

\* cited by examiner

*Primary Examiner*—Nadine G Norton
*Assistant Examiner*—Mahmoud Dahimene
(74) *Attorney, Agent, or Firm*—Baker & McKenzie LLP

(57) ABSTRACT

A novel cleaning method for preventing defects and particles resulting from post tungsten etch back or tungsten chemical mechanical polish is provided. The cleaning method comprises providing a stack structure of a semiconductor device including a tungsten plug in a dielectric layer. The tungsten plug has a top excess portion. A surface of the stack structure is then contacted with a cleaning solution comprising hydrogen peroxide. Next, the surface of the stack structure is contacted with dilute hydrofluoric acid. The cleaning solution and hydrofluoric acid are capable of removing the top excess portion and particles on the surface of the stack structure.

24 Claims, 4 Drawing Sheets

CLEANING METHOD FOR USE IN SEMICONDUCTOR DEVICE FABRICATION

BACKGROUND OF THE INVENTION

1. Field of the Invention

The present invention generally relates to a cleaning method for use in semiconductor device fabrication, and, more particularly, to a cleaning method for preventing or reducing defects and particles resulting from post-tungsten etch back or tungsten chemical mechanical polish.

2. Description of the Related Art

In semiconductor chip fabrication processing, it is well known that there is a need to clean the surface of the wafer after certain fabrication operations that leave unwanted residues or organic contaminants on the wafer surface. Examples of such fabrication operations include plasma etching (e.g., tungsten etch back (WEB)) and chemical mechanical polishing (CMP).

If unwanted residual materials or organic contaminants are left on the wafer surface during subsequent fabrication operations, this may cause inappropriate interactions between metallization features. In some cases, such defects may cause devices on the wafer to become inoperable. In order to avoid the undue costs of discarding wafers having inoperable devices, it is desirable to clean the wafer adequately, yet efficiently, after fabrication operations that leaves unwanted residue or contaminants on the wafer surface.

FIG. 1 is a schematic diagram illustrating unwanted residues or organic contaminants that remain on a wafer surface after a tungsten etch back or a tungsten chemical mechanical polish is applied in the conventional fabrication method to form a metal via.

A first layer 100, which may be a semiconductor substrate or a stack layer with a metal layer formed on a semiconductor substrate, is provided. A dielectric layer 105 is formed and patterned to form vias 110, which expose a portion of the first layer 100. A conforming metal barrier layer 115 is then formed on the patterned dielectric layer 105 and covers the profile of the vias 110, wherein the metal barrier layer 115 may include a Titanium nitride layer. A blanket metal layer 120, preferably a tungsten layer, is formed on the metal barrier layer 115 and into the vias 110, wherein the method for forming the tungsten layer 120 includes chemical vapor deposition (CVD). A tungsten etch back or tungsten chemical mechanical polish is performed to remove a portion of the tungsten layer 120 outside the vias 110 until the top surface of the tungsten layer 120 in the vias is close to the level of the top surface of the metal barrier layer 115, thus forming tungsten plugs 120a. Conventionally, the top portions of the tungsten plugs 120a are higher than the level of the top surface of the metal barrier layer 115 so as to avoid over polish or dishing of chemical mechanical polish. However, as the size of semiconductor devices shrinks, distances between adjacent tungsten plugs 120a also shorten. Thus, the top excess portions (dotted areas) of adjacent tungsten plugs 120a need to be removed to prevent the tungsten plugs 120a from contacting with each other and resulting in electrical short circuits.

Unwanted residues or organic containments (i.e. defects and particles) 125 produced during tungsten etch back or tungsten chemical mechanical polish may be left on the surface of the tungsten plugs 120a or the metal barrier layer 115. The defects and particles 125 remaining on the metal barrier layer 115 or the tungsten plugs 120a may provide a large resistance which affects the performance and the reliability of the device. Thus, the overall yield from the metal via fabrication process is reduced.

Traditionally, defects and particles 125 on the surface of the tungsten plugs 120a and the metal barrier layer 115 are removed by utilizing a DNS (Dai Nippon Screen brush) cleaner, which is used to brush clean the surface of the tungsten plugs 120a and the metal barrier layer 115. However, a problem with using the DNS cleaner is that it can scratch the surface of the tungsten plugs 120a and the metal barrier layer 115 while attempting to remove the residual particles or etching residue.

U.S. Pat. No. 5,804,091, granted Sep. 8, 1998, Lo et al., discloses a method of preventing defects and particles produced after tungsten etch back. The method includes utilizing an Ar plasma process, baking process, and D.I. water flushing with mega-sonic shaking to reduce defects and particles on the wafer surface. However, the method fails to reduce small-sized defects and particles 125 and fails to remove the top excess portion of the tungsten plugs 120a.

In view of the foregoing, there is a need for a cleaning method for effectively removing particles, defects and top excess portions of the tungsten plug in post tungsten etch back or tungsten chemical mechanical polish operations.

SUMMARY OF THE INVENTION

To achieve the foregoing and other objects, and in accordance with purposes of the present invention, as described herein, embodiments of the present invention provide a cleaning method for preventing defects and particles for post tungsten etch back or tungsten chemical mechanical polish.

One aspect of the present invention is to provide a cleaning method used in semiconductor device fabrication. The cleaning method comprises providing a stack structure of a semiconductor device including a tungsten plug in a dielectric layer. The tungsten plug has a top excess portion. A surface of the stack structure is contacted with a cleaning solution comprising hydrogen peroxide ($H_2O_2$). The surface of the stack structure is then contacted with dilute hydrofluoric acid (DHF). The cleaning solution and hydrofluoric acid are capable of removing the top excess portion and particles on the surface of the stack structure.

Another aspect of the present invention is to provide a method of forming a semiconductor device. The method comprises: providing a dielectric layer with a via. Tungsten is deposited over the via of the dielectric layer. Next, part of the tungsten is removed, leaving a top excess portion of tungsten. The semiconductor device is then contacted with a cleaning solution comprising hydrogen peroxide. The semiconductor device is then contacted with dilute hydrofluoric acid. These contacting steps are capable of removing the top excess portion of tungsten and cleaning the semiconductor device.

The cleaning solution may further comprise ammonium hydroxide ($NH_4OH$), in which a volume ratio of hydrogen peroxide, ammonium hydroxide and deionized water is 1:4:110. The step of contacting a surface of the stack structure with a cleaning solution may be conducted at a temperature within a range of 20° C. to 70° C. and for a period within a range of 1-10 minutes, and optionally may be conducted with mega-sonic shaking.

Dilute hydrofluoric acid may include a volume ratio of 500:1 deionized water: hydrofluoric acid (HF). The step of contacting a surface of the stack structure with dilute hydrofluoric acid may be conducted at a temperature of 30° C. and for 4 minutes.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate embodiments of the invention and, together with the description, serve to explain features, advantages, and principles of the invention.

DETAILED DESCRIPTION OF PREFERRED EMBODIMENTS

Figure 1A:
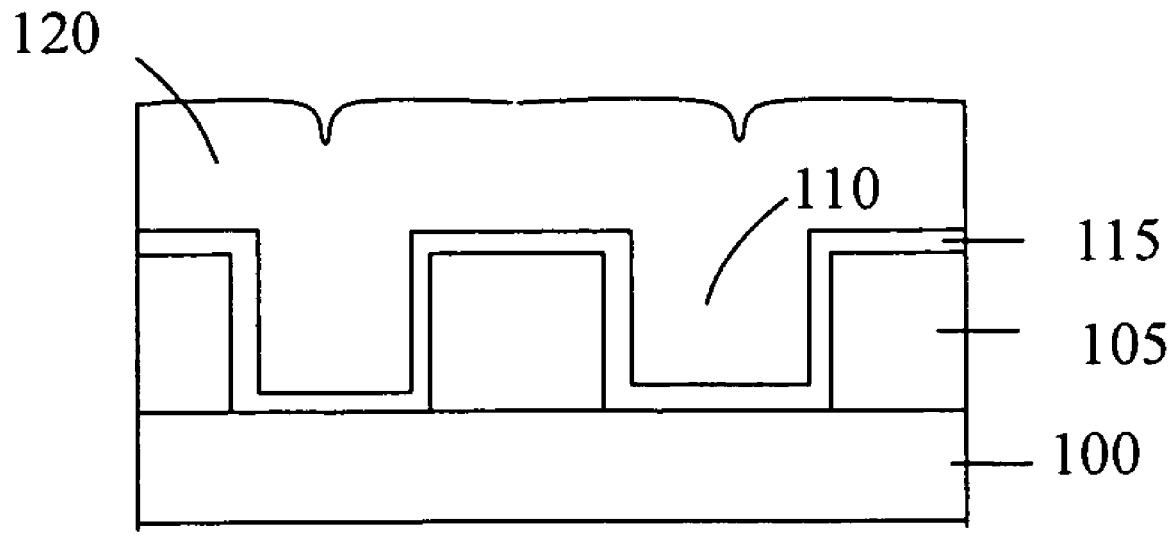
FIGS. 1A-1B are schematic cross-sectional views illustrating a conventional method of forming tungsten plugs.
Figure 1B:
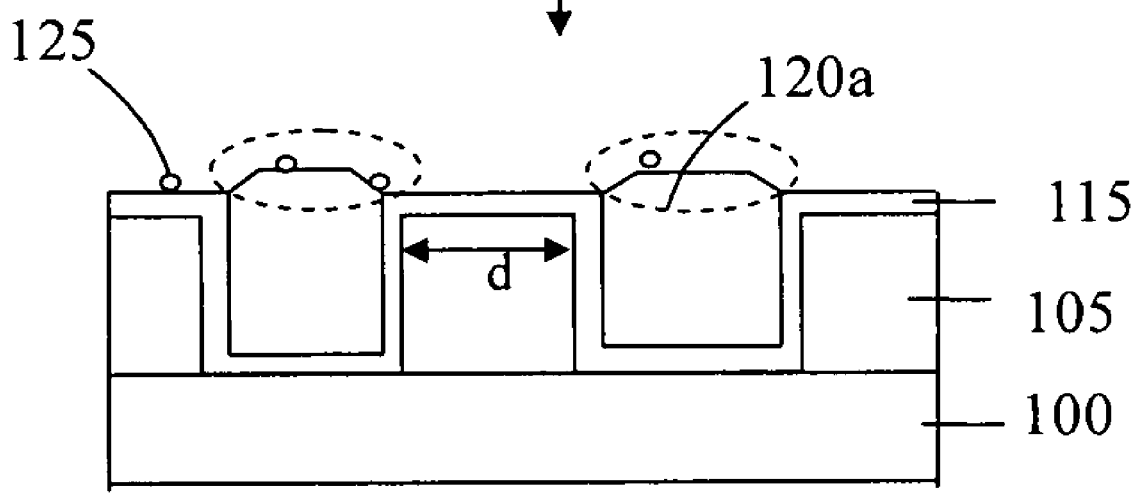
Figure 2A:
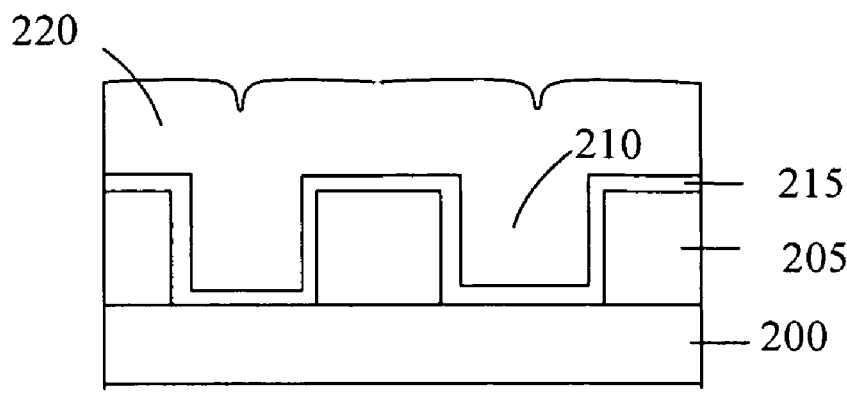
FIGS. 2A-2C are schematic cross-sectional views of forming tungsten plugs in accordance with certain embodiments of the present invention.
Figure 2B:
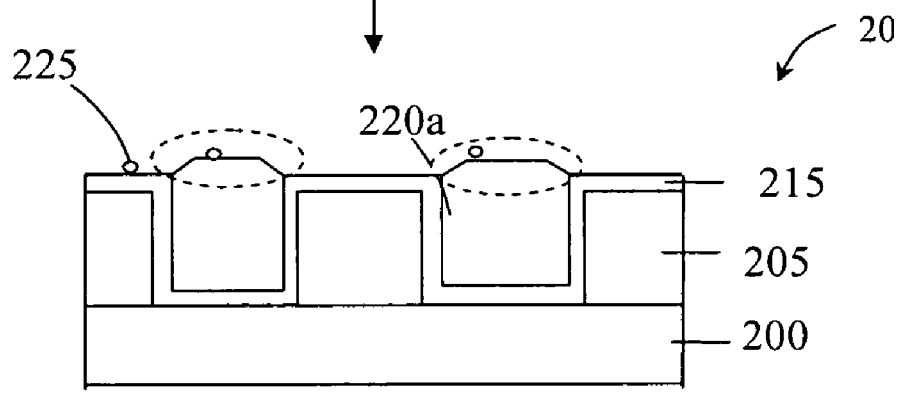
Figure 2C:
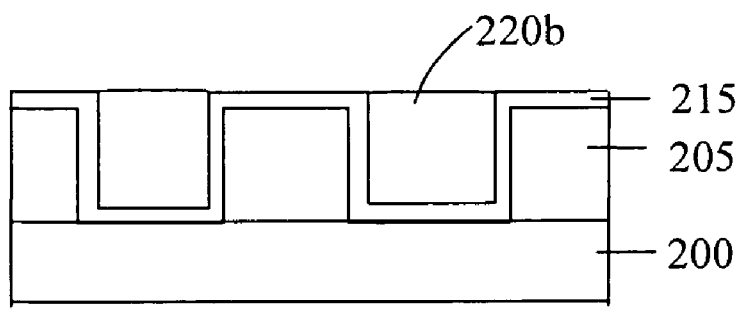

FIGS. 2A-2C are schematic diagrams illustrating the formation of contact plugs in a dielectric layer in accordance with certain embodiments of the present invention. The process sequence is performed with a first layer 200, having a dielectric layer 205 with a low dielectric constant, such as silicon oxide or doped silicon oxide (e.g. borophosphosilicate glass, BPSG) formed thereon. The first layer 200 may be a semiconductor substrate or a stack layer with a metal layer formed on a semiconductor substrate. Vias 210 are patterned and etched into the dielectric layer 205 to expose the first layer 200. A conforming metal barrier layer 215, such as a single layer of titanium nitride (TiN) or a bilayer of titanium and titanium nitride (Ti/TiN), is deposited in the vias 210 and on the field of the dielectric layer 205 to provide an adhesive layer on which contact vias 220, such as tungsten can be deposited using chemical vapor deposition (CVD), plasma enhanced chemical vapor deposition (PECVD), high-density plasma chemical vapor deposition (HDP CVD) or other deposition techniques to fill the vias 210. Tungsten is deposited as a blanket layer to fill the vias 210 and form the blanket layer 220, as shown in FIG. 2A.

A tungsten chemical mechanical polishing process or a tungsten etch back process is then performed to remove part of the tungsten outside the vias 210, leaving the vias 210 filled with tungsten, and tungsten plugs 220a are therefore formed. It is should be noted that top excess portions of tungsten plugs 220a near the vias 210 remain (dotted area). Defects and particles 225 on the tungsten plugs 220a or metal barrier layer 215 may be tungsten, tungsten oxide, chemical residuals from the process of tungsten etch back or tungsten chemical mechanical polish, or contaminates, as shown in FIG. 2B. Next, the cleaning method of one embodiment in accordance with the present invention is performed and the resulting cleaned structure is shown in FIG. 2C. FIG. 2C shows that the top surface of the tungsten plugs 220b is approximately level with the top surface of the metal barrier layer 215 and that no defects or particles thereon are present.

Figure 3:
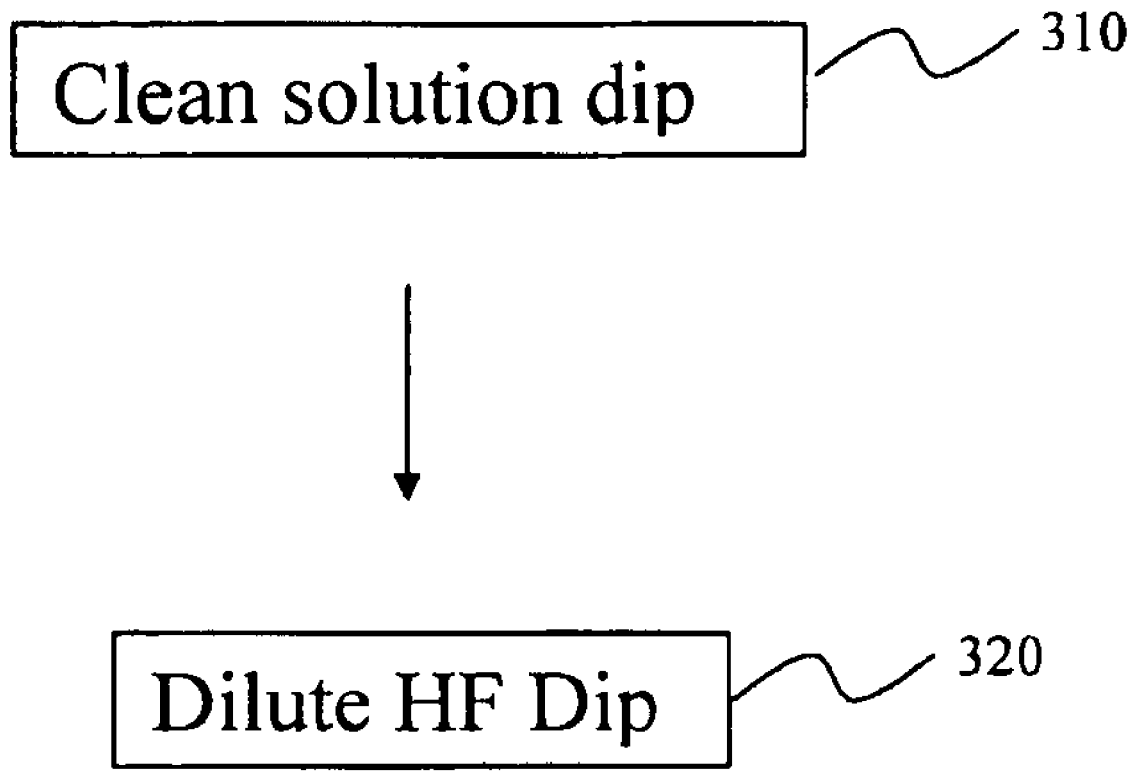
FIG. 3 is a process flow chart of one embodiment of the present invention.

FIG. 3 shows a process flow chart for a cleaning method in accordance with certain embodiments of the present invention. An unclean sample having a contact plug with a top excess portion, such as the structure 20 shown in FIG. 2B, is contacted with a cleaning solution (step 310), optionally accompanied by mega-sonic shaking. Next, it is contacted with dilute hydrofluoric acid (step 320). Optionally, the unclean sample may be rinsed or flushed with deionized water before and/or after contact with the cleaning solution or dilute hydrofluoric acid. The cleaning solution may include hydrogen peroxide ($H_2O_2$) and ammonium hydroxide ($NH_4OH$) mixed in a specific volume ratio (v/v). The specific volume ratio of hydrogen peroxide and ammonium hydroxide will be illustrated later.

When the sample (e.g. structure 20 in FIG. 2B) is dipped in the cleaning solution and optionally shaken by a mega-sonic machine, hydrogen dioxide will oxidize the exposed portions of the tungsten plugs 220a (i.e. the top excess portions of the tungsten plugs 220a) which, in effect, may aggressively clean any defects and particles 225 on the tungsten plugs 220a or the metal barrier layer 215. This process results in oxidation of the top excess portions of the tungsten plugs 220a. This oxidation is thereafter removed with the ammonium hydroxide. Mega-sonic shaking facilitates removing defects and particles 225, such as tungsten, tungsten oxide, and chemical residuals or contaminates from the surface of the tungsten plugs 220a and the metal barrier layer 215.

The sample (e.g. structure 20 in FIG. 2B) is optionally rinsed with deionized water after the cleaning solution dip. Next, a dilute hydrofluoric acid dip is carried out at, preferably, a temperature of 30° C. for 4 minutes in step 320. Dilute hydrofluoric acid is used to remove the residual tungsten oxide oxidized by hydrogen peroxide. Preferably, the volume ratio of hydrofluoric acid to deionized water is no greater than 1:500, since hydrofluoric acid with higher concentration may etch the surface of dielectric layer 205, in FIG. 2C. In one embodiment of the present invention, dilute hydrofluoric acid is preferably prepared by diluting hydrofluoric acid (49% by weight) with deionized water in a volume ratio of 1:500.

Figure 4:
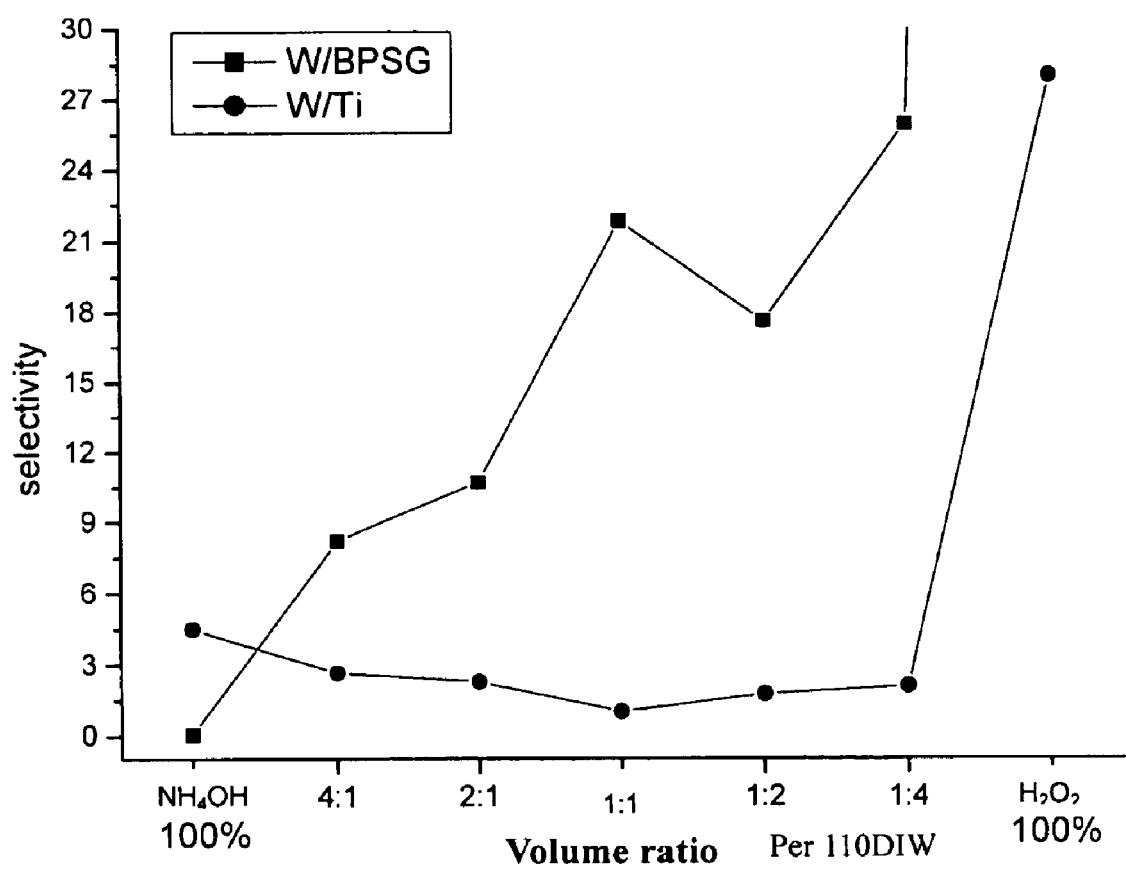
FIG. 4 is a plot showing the selectivity for etching tungsten relative to borophosphosilicate glass or Titanium and Titanium nitride (Ti/TiN) under various volume ratios of hydrogen peroxide to ammonium hydroxide.

The specific volume ratio of hydrogen peroxide and ammonium hydroxide in the cleaning solution may be selected based on the selectivity for etching tungsten (W) relative to the dielectric (e.g. borophosphosilicate glass, BPSG) or the metal barrier (e.g. Titanium and Titanium nitride, Ti/TiN). FIG. 4 is a plot showing the selectivity for etching W relative to BPSG or Ti/TiN under various volume ratios of $H_2O_2$ to $NH_4OH$. The selectivity of etching tungsten relative to the dielectric is defined as a ratio of etching rate (Å/min) of tungsten to that of BPSG, and the selectivity of etching tungsten relative to the Ti/TiN is defined as a ratio of etching rate of tungsten to that of Ti/TiN. For example, hydrogen peroxide (31% by weight) and ammonium hydroxide (29% by weight) in the cleaning solution may be at a volume ratio of 1:4, and the step carried out at a temperature of 25° C. In a preferred embodiment, the cleaning solution of hydrogen peroxide (31% by weight) and ammonium hydroxide (29% by weight) in deionized water is at a volume ratio of 1:4:110 (i.e. $H_2O_2$: $NH_4OH$: DIW=1:4:110). In these process conditions, the etching rate of W is about 50 Å/min, the etching rate of BPSG is about 20 Å/min and the etching rate of Ti/TiN is about 6 Å/min, and thus the selectivity for etching W related to BPSG and Ti/TiN are about 2.5 and about 8 respectively.

As shown in FIG. 4, the selectivity for etching W related to BPSG and Ti/TiN trends up as the volume ratio of the $H_2O_2$ to $NH_4OH$ increases, which indicates that the top excess portion of the tungsten plugs 220a (see dotted area of FIG. 2B) may be removed with no or little damage to the dielectric layer 205 and the metal barrier layer 215. However, as result of high etch selectivity, the process time of this step may be too short to control. The range of the volume ratio of $H_2O_2$ to $NH_4OH$ is preferably from 1:1 to 1:4, and more preferably is 1:4. The volume ratio of $H_2O_2$ to DIW is preferably in the range of 1:80 to 1:200, and more preferably is in the range of 1:110. Other specific process conditions of this process may be as follows: the process time is preferably in the range of 1 minute to 10 minutes, and more preferably is 4 minutes; the temperature is preferably in the range of 20° C. to 70° C., and more preferably is 25° C. In addition, it will be recognized that volume ratios of $H_2O_2$, $NH_4OH$ to DIW, process time and temperature may be varied to provide a balanced environment for cleaning the sample (e.g. structure 20 in FIG. 2B). The selectivity of etching tungsten related to BPSG or Ti/TiN is greater than 1 upon these process conditions, which indicates that the top excess portions of the tungsten plugs 220a can be effectively removed with no or little damage to the dielectric layer 205 and the metal barrier layer 215. Moreover, these process conditions will be well controlled. In one embodiment of the present invention, the cleaning solution is preferably prepared by mixing a $H_2O_2$ aqueous solution (31% by weight) with a $NH_4OH$ aqueous solution (29% by weight) in a specific volume ratio (e.g. 1:1 to 1:4) and then diluting the mixture with deionized water by a volume ratio in the range of 1:80 to 1:200.

In a preferred embodiment of the present invention based on a compromise between process conditions mentioned above, the process of cleaning a unclean sample having a top excess portion of a contact plug, such as the structure 20 shown in FIG. 2B is as follows: the sample is first dipped in the cleaning solution, for 4 minutes at a temperature of 25° C., in which the volume ratio of the $H_2O_2$, $NH_4OH$ to DIW is 1:4:110, and shaken by a mega-sonic machine simultaneously. The sample is then flushed or rinsed with deionized water to remove residual chemicals (i.e. $H_2O_2$ and $NH_4OH$) on the sample. Next, the sample is dipped in dilute hydrofluoric acid at a temperature of 30° C. for 4 minutes. Consequently, the top excess portions of the tungsten plugs, defects and particles are removed, as in the structure shown in FIG. 2C.

In an alternative embodiment of the present invention, the cleaning solution merely includes dilute hydrogen peroxide instead of the mixture of hydrogen peroxide and ammonium hydroxide. Dilute hydrogen peroxide is preferably prepared by diluting hydrogen peroxide (31% by weight) with deionized water in a volume ratio of 1:110. Dilute hydrofluoric acid is preferably prepared by diluting hydrofluoric acid (49% by weight) with deionized water in a volume ratio of 1:500. The cleaning method in this case is similar to that mentioned in the previous embodiments except that this cleaning method is preferably performed repeatedly. In particular, the sample is dipped in dilute hydrogen peroxide for 2 minutes, flushed or rinsed with deionized water, and then transferred to dilute hydrofluoric acid (e.g. 49% by weight) for 2 minutes. These processes are repeated at least three times. Consequently, defects and particles 225 can be sufficiently removed from the surface of the tungsten plugs 220a and the metal barrier layer 215, and the top excess portions of the tungsten plugs 220a can also be removed.

It will be apparent to those skilled in the art that various modifications and variations can be made in the disclosed process without departing from the scope or spirit of the present invention. For example, the technique described is suitable for use in damascene, dual damascene or other metal connect processes known in the art. Other embodiments of the invention will be apparent to those skilled in the art from consideration of the specification and practice of the invention disclosed herein. It is intended that the specification and examples be considered as exemplary only, with a true scope of the invention being indicated by the following claims and their equivalents.

We claim:

1. A cleaning method used in a semiconductor device manufacturing process, comprising:
   providing a stack structure of a semiconductor device, including a contact plug within an opening in a dielectric layer, a metal barrier layer between the dielectric layer and the contact plug in the opening, and extending along an upper surface of the dielectric layer with a first thickness having an exposed upper surface, the contact plug having a top excess portion that extends from the opening of the dielectric layer and above the exposed upper surface of the metal barrier layer that extends along the upper surface of the dielectric layer;
   contacting a surface of the stack structure with a cleaning solution comprising hydrogen peroxide ($H_2O_2$) and ammonium hydroxide ($NH_4OH$) to oxidize and remove the top excess portion of the contact plug; and
   contacting the surface of the stack structure with dilute hydrofluoric acid (DHF) to remove any residual portions of the oxidized top excess portion of the contact plug,
   wherein the contacting steps remove the top excess portion of the contact plug to a position substantially level with the upper surface of the metal barrier layer at the first thickness and clean the surface of the stack structure while retaining a substantial portion of the contact plug within the opening of the dielectric layer.

2. The method of claim 1, wherein the contact plug is tungsten plug.

3. The method of claim 1, wherein the hydrogen peroxide is diluted in a volume ratio deionized water:hydrogen peroxide in a range of about 200:1 to 80:1.

4. The method of claim 1, wherein a volume ratio of hydrogen peroxide:ammonium hydroxide is in a range of about 1:4 to 1:1.

5. The method of claim 1, wherein the step of contacting the surface of the stack structure with a cleaning solution is performed at a temperature within a range of 20° C. to 70° C.

6. The method of claim 1, wherein the metal barrier layer comprises at least one of titanium and titanium nitride.

7. The method of claim 1, wherein the metal barrier layer extends into another opening in the dielectric layer.

8. The method of claim 1, wherein each of the contacting steps include dipping the stack structure into one of the cleaning solution and the dilute hydrofluoric acid.

9. The method of claim 8, wherein the dipping includes shaking the cleaning solution.

10. The method of claim 9, wherein the shaking includes mega-sonic shaking of the cleaning solution.

11. The method of claim 1, wherein each of the contacting steps include dipping the device into one of the cleaning solution and the dilute hydrofluoric acid.

12. The method of claim 11, wherein the dipping includes shaking the cleaning solution.

13. The method of claim 12, wherein the shaking includes mega-sonic shaking of the cleaning solution.

14. A method of forming a semiconductor device, comprising:
   providing a dielectric layer, with at least one opening, on a semiconductor substrate;
   providing a metal barrier layer within the at least one opening and along an upper surface of the dielectric layer at a first thickness;
   depositing conductive material over the dielectric layer and the metal barrier layer;
   forming a conductive plug by removing the conductive material from an upper surface of the metal barrier layer exposing an upper surface of the metal barrier layer and a portion of the conductive material corresponding to the at least one opening leaving a top excess portion of the conductive plug that extends from the opening of the dielectric layer above the upper surface of the metal barrier layer;

contacting the device with a cleaning solution comprising hydrogen peroxide ($H_2O_2$) and ammonium hydroxide ($NH_4OH$) to oxidize and remove the top excess portion of the contact plug; and contacting the device with dilute hydrofluoric acid (DHF) to remove any residual portions of the oxidized top excess portion of the contact plug;

wherein the contacting steps remove the top excess portion of the conductive plug to a position substantially level with the upper surface of the metal barrier layer at the first thickness and clean the semiconductor device while retaining a substantial portion of the conductive plug within the opening of the dielectric layer.

15. The method of claim 14, wherein the hydrogen peroxide is diluted in a volume ratio of deionized water:hydrogen peroxide in a range of about 200:1 to 80:1.

16. The method of claim 14, wherein a volume ratio of hydrogen peroxide:ammonium hydroxide is in a range of about 1:4 to 1:1.

17. The method of claim 14, wherein the step of contacting with a cleaning solution is performed at a temperature within a range of 20° C. to 70° C.

18. The method of claim 14, wherein the step of contacting with a cleaning solution is performed for a period within a range of 1-10 minutes.

19. The method of claim 14, wherein the step of removing the conductive material from the upper surface of the metal barrier layer is carried out by a chemical mechanical polish (CMP).

20. The method of claim 14, wherein the step of removing the conductive material from the upper surface of the metal barrier layer is carried out by an etch back process.

21. The method of claim 14, wherein the conductive material is a tungsten layer.

22. The method of claim 14, wherein the metal barrier layer comprise at least one of titanium and titanium nitride.

23. The method of claim 14, wherein the metal barrier layer extends into a second opening in the dielectric layer.

24. A cleaning method used in a semiconductor device manufacturing process, comprising:

providing a stack structure of a semiconductor device, including a contact plug within an opening in a dielectric layer, a metal barrier layer between the dielectric layer and the contact plug in the opening, and extending along an upper surface of the dielectric layer with a first thickness having an exposed upper surface, the contact plug having a top excess portion that extends from the opening of the dielectric layer and above the exposed upper surface of the metal barrier layer that extends along the upper surface of the dielectric layer;

dipping the stack structure into a cleaning solution comprising hydrogen peroxide ($H_2O_2$) and ammonium hydroxide ($NH_4OH$) to oxidize and remove the top excess portion of the contact plug, the cleaning solution being shaken during the dipping; and dipping the stack structure into dilute hydrofluoric acid (DHF) to remove any residual portions of the oxidized top excess portion of the contact plug, wherein the dipping steps remove the top excess portion of the contact plug to a position substantially level with the upper surface of the metal barrier layer at the first thickness and clean the surface of the stack structure while retaining a substantial portion of the contact plug within the opening of the dielectric layer.

* * * * *